(12) United States Patent
Green et al.

(10) Patent No.: US 6,608,530 B1
(45) Date of Patent: Aug. 19, 2003

(54) ENHANCED ZDB FEEDBACK METHODOLOGY UTILIZING BINARY WEIGHTED TECHNIQUES

(75) Inventors: David Green, Snohomish, WA (US); Daigo Katagiri, Mill Creek, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/017,709

(22) Filed: Dec. 14, 2001

(51) Int. Cl.[7] .............................. H03L 7/07; H03L 7/08
(52) U.S. Cl. .............................. 331/25; 331/2; 331/14; 331/18; 327/147; 327/156; 327/295
(58) Field of Search .............................. 331/1 A, 2, 10, 331/14, 17, 18, 25; 327/147–150, 156–159, 295–297

(56) References Cited

U.S. PATENT DOCUMENTS

| | | | | |
|---|---|---|---|---|
| 5,307,381 A | * | 4/1994 | Ahuja | 375/356 |
| 5,614,855 A | | 3/1997 | Lee et al. | 327/158 |
| 5,777,498 A | * | 7/1998 | Cometti et al. | 327/156 |
| 5,900,752 A | | 5/1999 | Mar | 327/143 |
| 5,952,834 A | | 9/1999 | Buckley | 324/613 |
| 5,999,025 A | * | 12/1999 | New | 327/156 |
| 6,127,865 A | | 10/2000 | Jefferson | 327/149 |
| 6,177,844 B1 | | 1/2001 | Sung et al. | 331/25 |
| 6,271,729 B2 | | 8/2001 | Sung et al. | 331/25 |

* cited by examiner

*Primary Examiner*—David C. Mis
(74) *Attorney, Agent, or Firm*—Christopher P. Maiorana, P.C.

(57) ABSTRACT

An apparatus comprising a first circuit and a second circuit. The first circuit may be configured to present a plurality of output clock signals in response to a reference clock signal and a feedback signal. The second circuit may be configured to select one of the plurality of output clock signals as the feedback signal in response to a first control signal. The first control signal may be configured to minimize a difference in delay between the plurality of output clock signals.

20 Claims, 5 Drawing Sheets

ENHANCED ZDB FEEDBACK METHODOLOGY UTILIZING BINARY WEIGHTED TECHNIQUES

FIELD OF THE INVENTION

The present invention relates to a method and/or architecture for implementing zero delay buffers (ZDBs) generally and, more particularly, to a method and/or architecture for implementing ZDB technology with multiple output clock instantiations of a reference clock input with a predicted delay.

BACKGROUND OF THE INVENTION

Zero delay buffer (ZDB) technology implements multiple output clock instantiations of a reference clock input (i.e., the output clock signals are derived from the reference clock signal) with delay on the output clock instantiations. ZDB circuits are typically implemented in the context of a phase locked loop (PLL) circuit or circuits. The delay mechanism is implemented as internal feedback and can be positive (the traditional approach) or negative (a relatively new concept).

The frequency timing relationship between input and output clocking rates typically maintains a 1:1 frequency ratio over a substantial input reference frequency range and, as such, the PLL circuitry is designed so that a wide variation in the input reference frequency range can be accommodated. While the majority of ZDB technology is implemented with the 1:1 relationship, other ratios (i.e., 2:1, 4:1, etc.) are implemented depending on output divisor structures. ZDB technology has a proportionally high input reference frequency when compared to standard frequency synthesizer topologies. ZDB technology has a high update rate and a low jitter output response.

Figure 1:
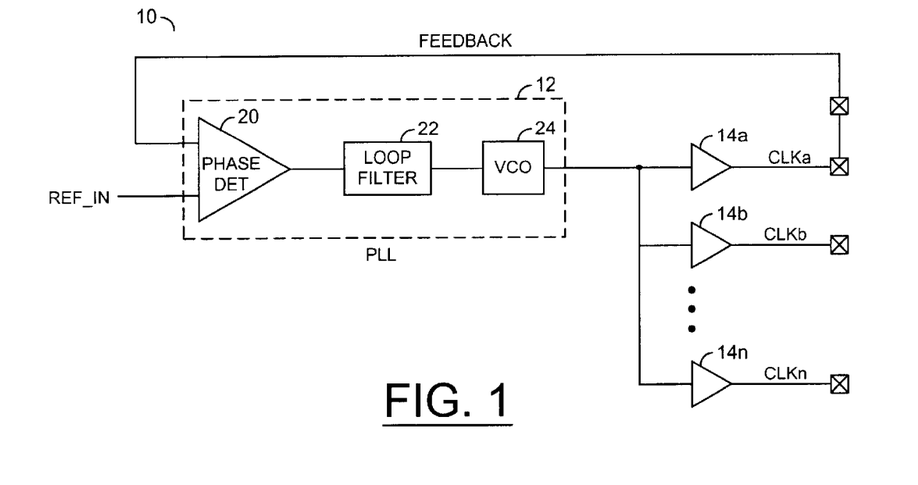
FIG. 1 is a block diagram of a conventional zero delay buffer circuit.

Referring to FIG. 1, a block diagram illustrating a conventional ZDB circuit 10 is shown. The ZDB circuit 10 includes a PLL 12 and a number of output buffers 14a–14n. The PLL 12 includes a phase detector 20, a loop filter 22, and a voltage controlled oscillator (VCO) 24 that are serially connected. The PLL 12 receives a reference input clock signal REF_IN at a first input to the phase detector 20 and the output buffers 14a–14n present clock signals CLKa–CLKn. One of the clock signals (i.e., CLKa) is also implemented as a feedback clock signal FEEDBACK to the PLL 12 at a second input to the phase detector 20.

In another implementation (not shown), the ZDB 10 includes a frequency divider circuit at the reference clock signal input to the phase detector 20. Similarly, the path of the signal FEEDBACK can include a frequency divider circuit that divides the signal FEEDBACK by the same or by a different value than the value that the signal REF_IN is divided by.

The VCO 24 frequency synthesizes an output clock signal that is presented to the buffers 14a–14n in response to the reference input frequency REF_IN and the divisor value (when implemented) in the feedback path. Under normal synthesizer operation, output frequency accuracy is a concern. However, for ZDB devices such as the circuit 10 the minute changes in the VCO 24 output frequency causes a slight phase difference between the signal REF_IN and the output clock signals CLKa–CLKn. The phase variation in the sampled time domain appears as a positive or negative delay depending if the VCO 24 output signal is slightly lagging or leading, respectively, the reference input REF_IN.

Since the ZDB 10 replicates the reference clock frequency input (i.e., REF_IN), multiple instantiations of the input clock are generated n times (i.e., the output clock signals CLKa–CLKn) to be distributed throughout the target system where the circuit 10 is implemented. That is, while the buffer 14a (i.e., the signal CLKa) is part of a closed-loop PLL system, the remaining output buffers 14b–14n (i.e., the signals CLKb–CLKn) function in an open-loop mode. The open-loop implementation of ZDB circuits is especially suited to clocking amplification. Clocking amplification is normally a limiting function in a digital system. Open-loop circuits are susceptible to independent propagation characteristics that are manifested under manufacturing specifications commonly defined as propagation delay. Propagation delay is characterized by the manufacturing product data sheet parameters that include minimum, typical, and maximum propagation delay specifications.

The open-loop nature of the circuit 10 indicates that an output response is susceptible to the variations in parametric elements such as temperature, supply voltage, loading effect propagation characteristics, etc. that are common to systems where ZDB circuits are implemented. To mitigate the impact of the parametric element variations, feedback is introduced. The introduction of feedback appears to be a trivial concept at first, especially in a 1:1 frequency relationship. However, feedback has a profound effect on the ZDB circuit. When feedback is introduced, the ZDB circuit becomes a closed-loop system. External factors such as temperature, supply voltage and output loading variations become part of the error term in the feedback path that is compensated or cancelled in the ZDB circuit. Feedback mitigates external effects and ensures high predictability and accuracy in the production of the output signal edges in the ZDB circuit.

Another important benefit of feedback is that the introduction of delay in a traditional open-loop system can be forced to a specific value in a closed-loop system. The fixed delay value is implemented via the feedback path forcing the VCO to compensate by proportionally speeding up (or slowing down) the edge rate of the VCO output signal, and thus forcing the phase detector inputs back into compliance. In a locked system, feedback compensates for inherent delay, and hence provides a true zerodelay path through the ZDB circuit.

Zero delay is defined as the edge alignment of the reference clock signal REF_IN edge input to the feedback buffered edge output (i.e., edge of the signals CLKa–CLKn). Some applications of ZDB type circuits require a known positive delay between reference and buffered output clock signals. Positive delay is generated via loading the non-feedback output buffer circuits. Negative delay can be generated via loading the feedback path (i.e., the signal FEEDBACK) with added capacitance. Delaying the signal FEEDBACK through capacitive loading forces the VCO 24 to speed up proportionally to compensate for the inherent delay in the feedback path placing the VCO 24 output clock signal edge prior to the input clock signal edge (hence negative delay).

The circuit 10 is implemented with one closed-loop path (i.e., the signal FEEDBACK via only the signal CLKa to the phase detector 20). The remaining output signals CLKb–CLKn operate in lock-step, but are not part of the closed loop system. As such, the output signals CLKb–CLKn are subject to parametric element variations impacting the overall response of each individual buffer 14b–14n. Thus, what may appear as closed-loop configurations for n−1 outputs, are really open-loop outputs driven by a common source. This indicates a difference in the delay of each of the signals CLKa–CLKn relative to the signal REF_IN.

It would be desirable to have a ZDB circuit that (i) minimizes the difference in delay between all output clock signals, (ii) is implemented in a minimal die area, (iii) is programmable for a variety of feedback selection mechanisms, (iv) has dual-modulus capability, and/or (v) may be configured as a synchronous clocking tree.

SUMMARY OF THE INVENTION

The present invention concerns an apparatus comprising a first circuit and a second circuit. The first circuit may be configured to present a plurality of output clock signals in response to a reference clock signal and a feedback signal. The second circuit may be configured to select one of the plurality of output clock signals as the feedback signal in response to a first control signal. The first control signal may be configured to minimize a difference in delay between the plurality of output clock signals.

The objects, features and advantages of the present invention include providing a method and/or architecture for implementing zero delay buffer (ZDB) technology with multiple output clock instantiations of a reference clock input with a predicted delay that may (i) significantly enhance product robustness, (ii) implement multiplexed feedback, (iii) implement multiplexed divisor banking, (iv) minimize the difference in delay between all output clock signals, (v) be implemented in a minimal die area, (vi) be programmable for a variety of fixed or real-time feedback selection mechanisms or schemes (e.g., round-robin, binary weighted, etc.), (vii) include compensation for the delay in the feedback selection, (viii) have dual-modulus capability, (vi) approximate a completely closed loop system with a single PLL, (ix) have reduced cost when compared to multiple PLL ZDB implementations, (x) optimize the system response, (xi) implement fractional frequency synthesis, (xii) mitigate variations in temperature, supply voltage, supply ground, and/or output loading effects, and/or (xiii) be configured as a synchronous clocking tree.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 2:
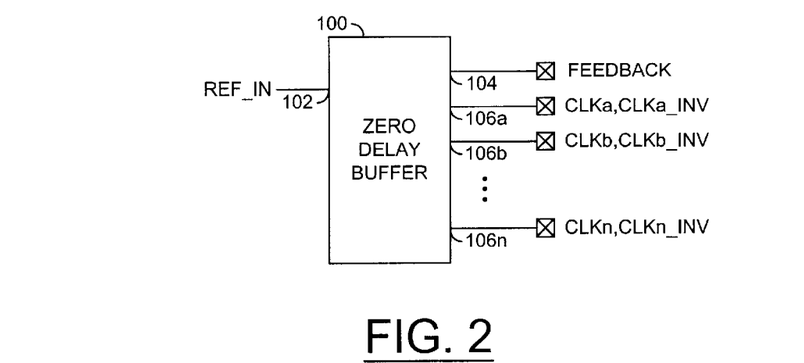
FIG. 2 is a block diagram of a preferred embodiment of the present invention.

Referring to FIG. 2, a diagram illustrating a circuit 100 in accordance with a preferred embodiment of the present invention is shown. The circuit 100 may be implemented as a zero delay buffer (ZDB) circuit having enhanced feedback methodology. The circuit 100 feedback methodology may implement a programmable controlled state machine to select one or more feedback signals such that the response of some or all of the output signals are included to approximate a completely closed-loop circuit. The closed-loop approximation may significantly enhance the robustness of product applications where the circuit 100 is implemented. The circuit 100 feedback methodology may utilize binary weighting techniques.

The circuit 100 may have an input 102 that may receive a signal (e.g., REF_IN), an output (or pin) 104 that may present a signal (e.g., FEEDBACK), and a number of outputs (or pins) 106a–106n that may present a number of signals (e.g., CLKa–CLKn or CLKa_INV–CLKn_INV). The circuit 100 is generally configured with one output 104. However, the circuit 100 may be implemented with more than one output 104 (described in connection with FIG. 6). The terminal 104 may be configured as an input. The circuit 100 is generally configured with a plurality (e.g., two or more) of the outputs 106a–106n. The circuit 100 generally presents a plurality of the signals CLK or CLK_INV.

The signal REF_IN may be a reference clock signal. The signal FEEDBACK may be implemented as a feedback clock signal. The signal FEEDBACK generally comprises a selected one of the signals CLKa–CLKn (or CLKa_INV-CLKn_INV). The signal CLK may be a ZDB output clock signal. The signal CLK_INV is generally the digital complement (e.g., inverse) of the signal CLK. The circuit 100 may be configured to generate the signals FEEDBACK and CLKa–CLKn (or CLKa_INV–CLKn_INV) in response to the signal REF_IN. The circuit 100 may be configured to control the generation of the signals CLKa–CLKn such that a difference between the respective delays of the signals CLKa–CLKn is minimized relative to the signal REF_IN (e.g., the delays of the signals CLKa–CLKn may be substantially equal). An edge of the signals CLKa–CLKn may have a zero (or fixed interval) delay relative to an edge of the signal REF_IN. The delay of the signals CLKa–CLKn may be predicted.

Figure 3:
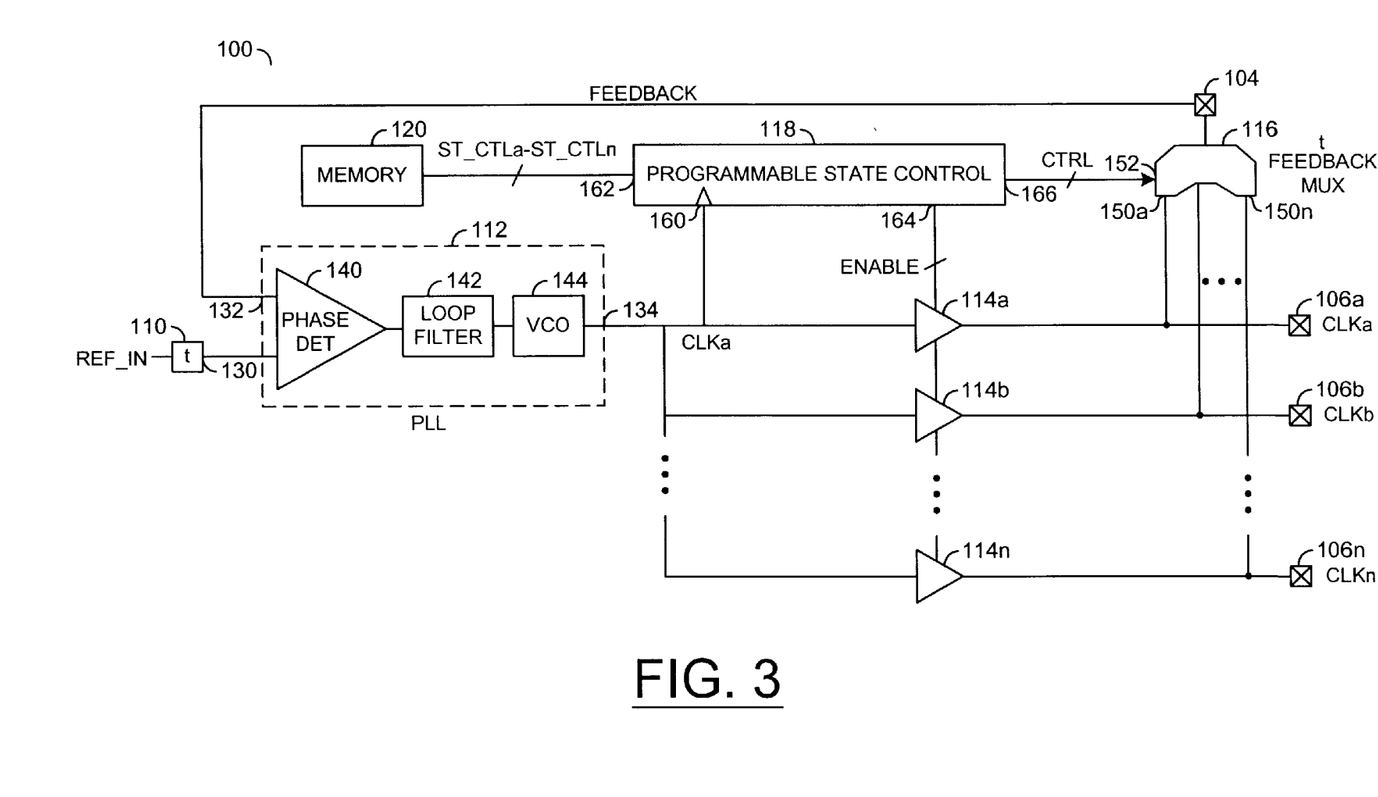
FIG. 3 is a detailed block diagram of the circuit of FIG. 2.

Referring to FIG. 3, a detailed block diagram illustrating the circuit 100 is shown. The circuit 100 generally comprises a circuit 110, a circuit 112, a number of circuits (or devices) 114a–114n, a circuit 116, a circuit 118, and a circuit 120. The circuit 110 may be implemented as a delay circuit (or element). The delay circuit 110 may be a passive (e.g., capacitive, RC, etc.) delay circuit or an active delay (e.g., delay loop, etc.) circuit. The circuit 112 may be implemented as a phase locked loop (PLL) circuit. In one example, the circuit 114 may be implemented as a tri-state (three-state) buffer amplifier. However, the circuit (or device) 114 may be implemented as any appropriate buffer circuit (e.g., amplifier, inverting amplifier (inverter), etc.) accordingly to meet the design criteria of a particular application. When the device 114 is implemented as an inverting amplifier, the circuit 100 may be configured to generate inverted clock signals (e.g., CLKa_INV–CLKn_INV, not shown).

The circuit 116 may be implemented as a multiplexer. In one example, the circuit 118 may be implemented as a programmable state control circuit. In another example, the circuit 118 may be implemented as a programable controlled state machine. However, the circuit 118 may be implemented as any appropriate multiplexer control circuit to meet the design criteria of a particular application. The circuit 120 may be implemented as a memory circuit. In one example, the memory circuit 120 may be a non-volatile memory implemented in silicon, oxide, nitride, oxide, silicon (SONOS) technology. In another example, the memory circuit 120 may be implemented as a flash memory. In another example, the circuit 120 may be implemented as a look-up table (LUT). However, the circuit 120 may be implemented as any appropriate memory accordingly to meet the design criteria of a particular application.

The circuit 110 may have an input that may receive the signal REF_IN and an output that may present the signal REF_IN. The circuit 110 may be configured to provide a time delay (e.g., τ) to the signal REF_IN. The delay τ may be equal to the time delay of the circuit 116. The circuit 110 may be configured to compensate for the time delay of the circuit 116. The circuit 110 may provide an effectively zero delay to the signals CLKa–CLKn relative to the signal REF_IN without post-manufacture adjustment and/or calibration of the circuit 100.

The PLL circuit 112 may have an input 130 that may receive the signal REF_IN delayed by the interval τ via the circuit 110. The circuit 112 may also have an input 132 that may receive the signal FEEDBACK and an output 134 that may present the signal CLKa. The circuit 112 generally comprises a circuit 140, a circuit 142, and a circuit 144. The circuits 140, 142 and 144 may be serially connected. The circuit 140 may be implemented as a phase detector. However, the circuit 140 may be implemented as any appropriate detector circuit (e.g., phase/frequency detector, etc.) accordingly to meet the design criteria of a particular application. The circuit 140 may have first and second inputs that may receive the signals REF_IN and FEEDBACK, respectively. The circuit 142 may be implemented as a loop filter. The circuit 144 may be implemented as a voltage controlled oscillator (VCO). The circuit 144 may have an output that may present the signal CLKa. The circuit 112 may be configured to generate the signal CLKa in response to the signals REF_IN and FEEDBACK.

Each of the circuits 114a–114n may have a first input (e.g., a signal input) that may receive the signal CLKa. The circuits 114a–114n may have a second input (e.g., an enable input) that may receive a respective bit of a multi-bit signal (e.g., ENABLE[0:s]) and an output that may present a respective signal (e.g., the signals CLKa–CLKn). The signal ENABLE is generally an s-bit digital signal, where s is an integer. The signal ENABLE may be a control signal. The signal ENABLE may be implemented to control a state (e.g., enabled or disabled (low impedance or high impedance)) of one or more of the circuits 114a–114n. The circuits 114a–114n may be configured to generate the signals CLKa–CLKn, respectively, in response to the signals CLKa and ENABLE.

The circuit 116 may have a plurality of inputs 150a–150n that may receive the signals CLKa–CLKn, respectively, an input 152 that may receive a signal (e.g., CTRL), and an output that may present the signal FEEDBACK. The signal CTRL may be a control signal. The signal CTRL is generally implemented as a multi-bit digital signal. The multiplexer circuit 116 may be configured to select one of the signals CLKa–CLKn as the signal FEEDBACK in response to the signal CTRL.

The circuit 118 may have an input 160 that may receive the signal CLKa, an input 162 that may receive a signal (e.g., ST_CTLa–ST_CTLr), an output 164 that may present the signal ENABLE, and an output 166 that may present the signal CTRL. The signal ST_CTL may be a control signal. The signal ST_CTL may be implemented as a multi-bit digital signal (e.g., an r-bit signal, where r is an integer). The signal ST_CTL may be implemented to select a mode of operation of the circuit 118. The circuit 118 may be configured to generate the signals ENABLE and CTRL in response to the signals REF_IN (via the signal CLKa) and ST_CTL. In one example, the circuit 118 may be configured to generate the signals ENABLE and CTRL in response to an edge of the signal REF_IN (via the signal CLKa). The circuit 120 may have a plurality of outputs that may present the signals ST_CTLa–ST_CTLr. The signal ST_CTL may be registered in the circuit 120. The signal ST_CTL is generally presented to the circuit 118 in response to programming in the circuit 120.

The circuit 100 is generally a closed-loop (e.g., feedback) circuit comprising the PLL circuit 112, the buffers 114, the multiplexer 116, and the feedback signal FEEDBACK path. The present invention may comprise a method and/or architecture wherein all of the output clock signals CLKa–CLKn may participate in the feedback process and only one PLL circuit 112 is implemented. The present invention may be implemented using significantly less (e.g., minimal) die area and reduced cost when compared to conventional ZDB designs that implement n PLL circuits with feedback for n output clocks. By implementing a multiplexed feedback, the present invention may time multiplex the plurality of output clock signals CLKa–CLKn to the one PLL 112.

The implementation of the multiplexed feedback in the circuit 100 may provide a mechanism or scheme for all of the output clock signals CLKa–CLKn to participate in the feedback process. The response time variation of the individual output clock signals CLKa–CLKn may be integrated via the response of the loop filter 142. The delay of the signals CLKa–CLKn relative to the signal REF_IN may be predicted. The integration effect in the circuit 100 may be implemented via the programmable multiplexer circuit 116. The multiplexer 116 may be configured to select one of the output clock signals CLKa–CLKn per cycle of the signal REF_IN.

Programing in the circuit 120 may be configured to implement a variety of feedback configurations for the circuit 100. In one example, the circuit 116 may be configured to select a particular (e.g., fixed) one of the output clock signals CLKa–CLKn as the signal FEEDBACK. A user may choose the particular signal CLKa–CLKn to be implemented as the signal FEEDBACK after a board (not shown) implementing the circuit 100 has been manufactured and the system (e.g., the board implementing the circuit 100) response has been optimized in response to one or more post-manufacture criteria (e.g., parametric elements). In conventional ZDB implementations, the system response must be optimized before the board is manufactured. However, optimization of the system response before the board is manufactured is not always practical and the output clock signal chosen as the feedback signal can generate sub-optimal system response. Post-manufacture criteria that may affect the response of the system include operating temperature, output loading, supply voltage variation, supply ground variation, operating frequency, etc.

In another example, the signal FEEDBACK may be selected from the signals CLKa–CLKn via a round-robin technique. The circuit 120 may be programmed to present the signal ST_CTL such that each of the signals CLKa–CLKn is selected as the signal FEEDBACK every 1/n cycles of the signal REF_IN. All of the signals CLKa–CLKn may be weighted equally. Selection of each of the signals CLKa–CLKn as the signal FEEDBACK every 1/n cycles of the signal REF_IN generally provides an equal amount of feedback to the PLL circuit 112 from each of the circuits connected to the pins 106a–106n (not shown). Selection of each of the signals CLKa–CLKn as the signal FEEDBACK every 1/n cycles of the signal REF_IN may provide equally distributed integration via the loop filter 142 since each signal CLKa–CLKn is sampled for a substantially equal time interval. When the selection of each of the signals CLKa–CLKn as the signal FEEDBACK every 1/n cycles of the signal REF_IN is implemented in the circuit 100, the circuit 118 may be implemented as a counter circuit that is configured to generate the signal CTRL in response to counts of the signal REF_IN via the signal CLKa.

In other examples, the circuit 120 may be programmed to present the signal ST_CTL using advanced techniques (e.g., binary weighting, etc.) wherein one or more combinations of the signals CLKa–CLKn may be selected as the signal FEEDBACK. The multiplexed selection of the signal FEEDBACK may be weighted such that one or more of the signals CLKa–CLKn are sampled more than others during a given time interval. Programming may be implemented in the circuit 120 (i) to toggle between selected signals CLKa–CLKn, (ii) grouping selected signals CLKa–CLKn, and/or (iii) sampling one or more of the signals CLKa–CLKn more than the others. Unequal weighting of the signals CLKa–CLKn may generate an integration best fit response for the circuit 100. The best fit response for the circuit 100 generally comprises a minimal difference in the delay between the output signals CLKa–CLKn. Unequal weighting of the signals CLKa–CLKn may generate best case setup and hold times for the particular application of the circuit 100. However, any appropriate programming may be implemented accordingly to meet the design criteria of a particular application.

The circuit 100 may be configured to approximate a completely closed-loop circuit using the single PLL circuit 112 and multiplexing one or more of the signals CLKa–CLKn as the signal FEEDBACK via the multiplexer 116. The circuit 100 may be configured to mitigate the effects of post-manufacture criteria effects (e.g., parametric elements) such as operating temperature, output loading, supply voltage variation, supply ground variation, and operating frequency. The signal CLKa–CLKn selected as the signal FEEDBACK may be fixed or dynamically (e.g., real-time) selected.

Figure 4:
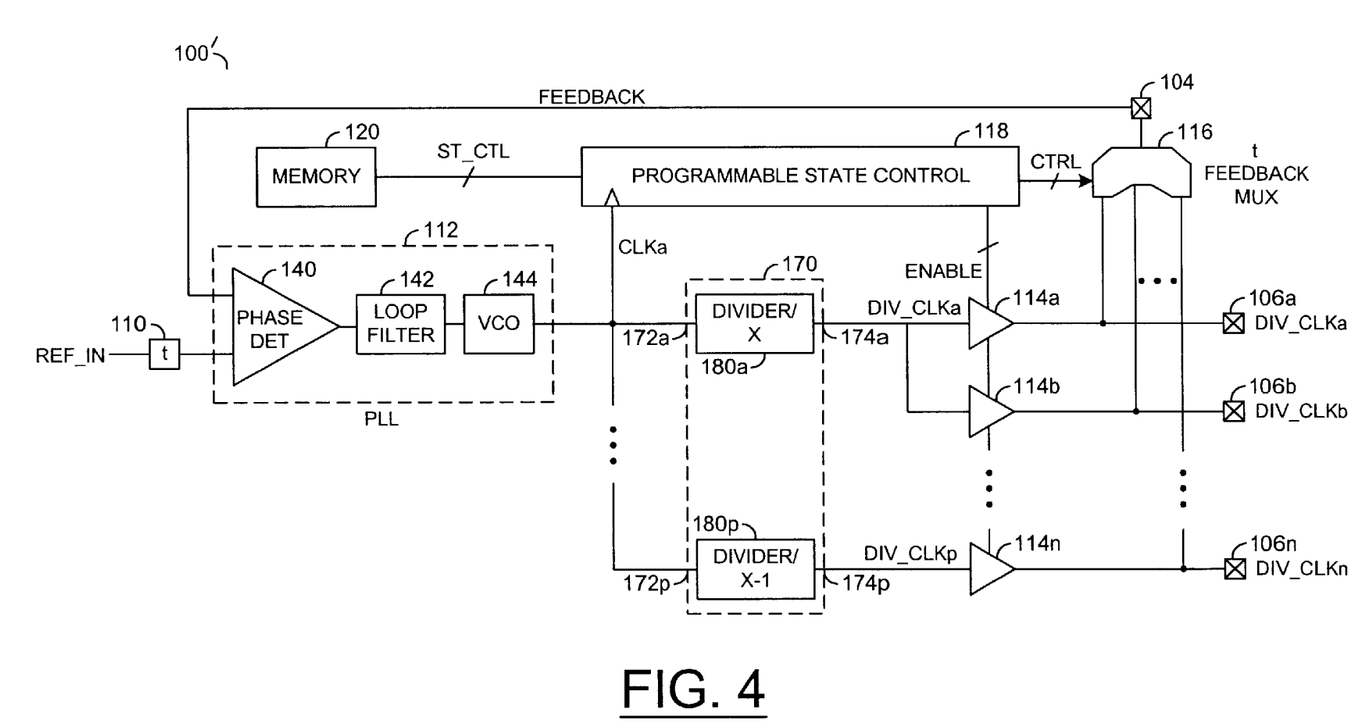
FIG. 4 is a block diagram of an alternative embodiment of the present invention.

Referring to FIG. 4, a block diagram illustrating a circuit 100' is shown. The circuit 100' may be an alternative embodiment of the present invention. The circuit 100' may be implemented similarly to the circuit 100. The circuit 100' may be implemented as a PLL tri-state ZDB circuit for clock tree synchronization. The circuit 100' may comprise a circuit 170. The circuit 170 may be implemented as a bank of divider circuits. The circuit 170 may have a number of inputs 172a–172p that may receive the signal CLKa, and a number of outputs 174a–174p that may present a number of signals (e.g., DIV_CLKa–DIV_CLKp, where p is an integer). The signals DIV_CLKa–DIV_CLKp may be implemented as divided versions of the signal CLKa. The circuit 170 may be configured to generate the signals DIV_CLKa–DIV_CLKp in response to the signal CLKa. Each of the signals DIV_CLKa–DIV_CLKp may be presented to one or more inputs of the circuits 114a–114n. The circuits 114a–114n may be configured to generate a plurality of clock signals (e.g., divided clock signals DIV_CLKa–DIV_CLKn) in response to the signals DIV_CLKa–DIV_CLKp and the signal ENABLE.

The circuit 170 generally comprises a number of circuits 180a–180p. The circuits 180 are generally implemented as divider circuits. In one example, the circuits 180a–180p may be implemented with a common divisor (e.g., x, where x is an integer). However, one or more of the circuits 180a–180p may be implemented with different divisor values (e.g., x, x–1 (swallow, e.g., decrement by one cycle of the signal REF_IN), etc.) accordingly to meet the design criteria of a particular application. The circuits 180a–180p may have an input that may receive the signal CLKa and an output that may present the signals DIV_CLKa–DIV_CLKp, respectively. The circuits 180a–180p may be configured to generate the signals DIV_CLKa–DIV_CLKp in response to the signal CLKa. The circuit 100' may be configured to generate the signal DIV_CLK at a frequency ratio relationship relative to the signal REF_IN other than 1:1 (e.g., 1:2, 1:4, etc.). The circuit 100' may be configured to add or swallow one or more cycles of the signal DIV_CLK relative to the signal REF_IN.

Figure 5:
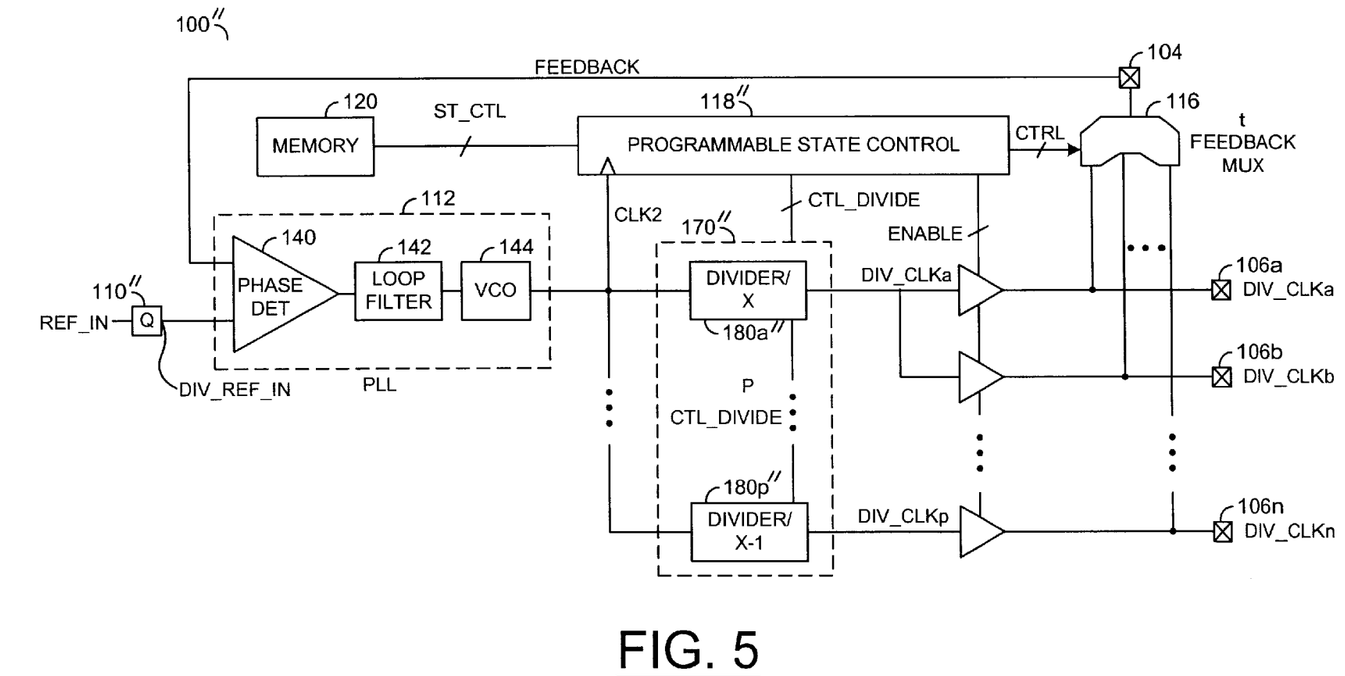
FIG. 5 is a block diagram of another alternative embodiment of the present invention.

Referring to FIG. 5, a block diagram illustrating a circuit 100" is shown. The circuit 100" may be another alternative embodiment of the present invention. The circuit 100" may be implemented similarly to the circuit 100'. The circuit 100" may be implemented as a dual-modulus ZDB circuit. The circuit 100" may comprise a circuit 110", a circuit 118", and a circuit 170". The circuit 110" may be implemented as a divider circuit (e.g., a divide-by-Q circuit, divide-by-x circuit, etc.). The circuit 110" may be configured to present a divided version of the signal REF_IN (e.g., DIV_REF_IN) to the input 130 of the PLL circuit 112. The circuit 110" may also be configured to provide the delay T to the signal DIV_REF_IN.

The circuit 118" may be implemented similarly to the circuit 118. The circuit 118" may have an output that may present a signal (e.g., CTL_DIVIDE) to an input of the circuit 170". The circuit 170" may be implemented similarly to the circuit 170. The circuit 170" may be implemented as a divider circuit bank (e.g., one or more divide-by-P circuits, one or more divide-by-x circuits, etc.). The signal CTL_DIVIDE may be a bank select control signal. The circuit 118" generally presents the signal CTL_DIVIDE in response to programming in the circuit 120 via the signal ST_CTL. The signal CTL_DIVIDE may control (e.g., multiplex and/or select the bank) the divide function of one or more of the circuits 180a"–180p" in the circuit 170". The signal CTL_DIVIDE may control the dual-modulus ZDB operation of the circuit 100" (e.g., the relationship between the Q and P circuits 110" and 170", respectively). The circuit 100" may be configured to generate one or more of the signals DIV_CLKa–DIV_CLKP at fractional frequencies (e.g., 1/P, P/Q, etc.) relative to the signal REF_IN.

Figure 6:
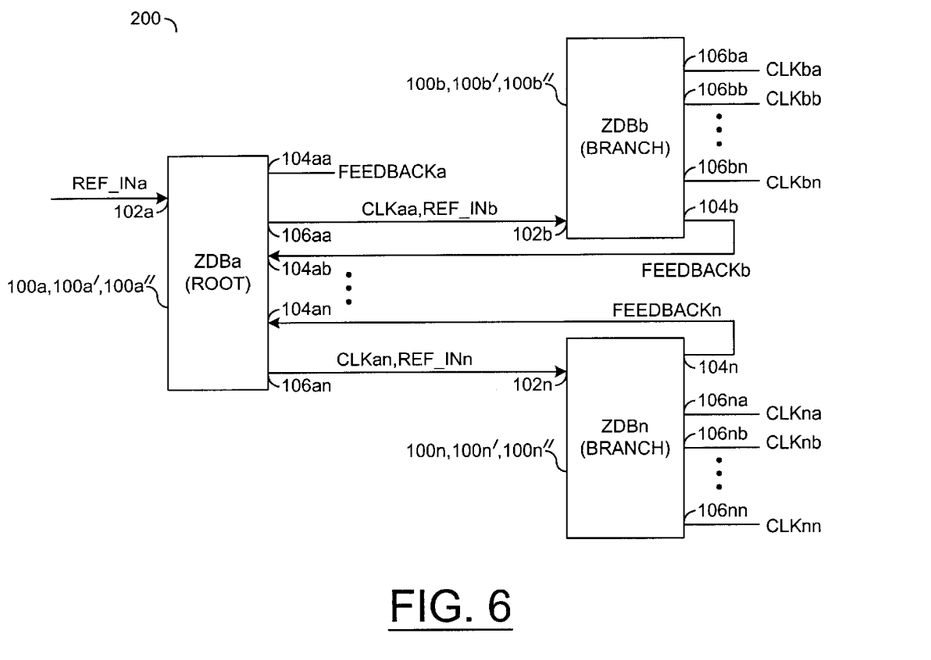
FIG. 6 is a block diagram of a synchronized clock tree structure implemented using the present invention.

Referring to FIG. 6, a block diagram of a circuit 200 illustrating a clock tree structure comprising a plurality of the circuits 100, 100', and/or 100" is shown. The circuit 200 may be implemented as a synchronized ZDB clock tree structure circuit. The circuit 114 is generally implemented as a tri-state buffer circuit in the circuit 200. The circuit 200 may be implemented as a first ZDB circuit 100a, 100a', or 100a" (e.g., a root circuit) having an input 102a that may receive a clock signal REF_INa, one or more inputs 104aa–104an that may receive the signals FEEDBACKa–FEEDBACKn, and one or more outputs 106aa–106an that may present the one or more of the signals CLKaa–CLKan as input reference signals (e.g., REF_INb–REF_INn) to one or more other ZDB circuits 100b–100n, 100b'–100n', and/or 100b"–100n" (e.g., branch circuits), respectively.

The circuits 100b–100n, 100b'–100n', and/or 100b"–100n" may have an input 102b–102n that may receive the signal REF_INb–REF_INn (CLKa–CLKn), an output 104b–104n that may present the signal FEEDBACKb–FEEDBACKn, and a number of outputs 106ba–106bn through 106na–106nn that may present the signals CLKba–CLKbn through CLKna–CLKnn, respectively. The circuit 100a, 100a', or 100a" may be configured to select one of the signals FEEDBACKa–FEEDBACKn as the respective feedback signal to the PLL 112a in response to the signal CTRLa. Similarly, each of the circuits 100b–100n, 100b'–100n', or 100b"–100n" may be configured to select a respective one of the signals CLKba–CLKbn through CLKna–CLKnn as the signal FEEDBACKb–FEEDBACKn. The circuit root ZDB circuit 100a may be configured to synchronize the branch ZDB circuits 100b–100n.

In one example, the circuits 100a–100n, 100a'–100n', and/or 100a"–100n" may implement the same selection mechanism (e.g., the same or similar programming may be implemented in the circuits 120a–120n) for the signals CTRLa–CTRLn. However, each of the mechanisms (or schemes) implemented for the selection of the feedback signals FEEDBACKa–FEEDBACKn in the circuits 100a–100n, 100a'–100n', or 100a"–100n" may be a mechanism (e.g., round-robin, binary weighted, etc.) appropriate to meet the design criteria of a particular application. The circuits 100a–100n, 100a'–100n', and/or 100a"–100n" generally select the respective signal CLKaa–CLKan through CLKna–CLKnn as the signal FEEDBACKa–FEEDBACKn in response to programming in the circuits 120a–120n that is unique to each of the circuits 120a–120n.

While the circuit 200 has been described in the context of a first stage (e.g., the circuit 100a, 100a', or 100a") and a second stage (e.g., the circuits 100b–100n, 100b'–100n', or 100b"–100n"), the circuit 200 may be implemented having any appropriate number of stages to meet the design criteria of a particular application. Furthermore, the circuit 200 may be implemented having one or more branches with more or fewer stages than other branches.

The present invention may implement programmable feedback selection from one of the output clock signals CLKa–CLKn to the PLL 112 via the multiplexer 116. The present invention may be configured to control the feedback multiplexing switch 116 in response to real-time edges of the input clocking signal REF_IN. The present invention may be configured to select the feedback signal FEEDBACK via the state machine 118. In one example, the state machine 118 may be configured to operate as a counter. The present invention may implement programming to control the selection of the output signal CLKa–CLKn as the signal FEEDBACK using unique weighting configurations per output clock signal. The present invention may implement the three-state selective buffer output buffer circuits 114 such that synchronization of clocking trees in the circuit 200 may be implemented. The present invention may be configured to program the feedback function via a bank select of the divider circuits 180 to generate a weighted dual-modulus response.

The present invention may be configured to store programmed feedback command statements in the memory circuit 120 (e.g., a SONOS, flash, etc. cell structure). The state machine 118 generally operates in a predictable manner in response to the programming in the circuit 120. The state machine 118 generally advances a state in response to a clock signal (e.g., the signal REF_IN via the signal CLKa). The multiplex switch 116 generally maps one of the output signals CLKa–CLKn to the feedback path (e.g., the signal FEEDBACK) in response to the control signal CTRL.

In one example, the feedback signal FEEDBACK may be delayed via a passive (e.g., capacitive) delay or active delay. When the PLL 112 is locked, the output signals CLKa–CLKn may all operate as closed-loop signals. The present invention may significantly enhance product robustness by providing a low cost solution to forcing a complete closed loop system over all of the output signals CLKa–CLKn while maintaining one PLL circuit 112.

The present invention may provide greater flexibility and optimized loading capability when compared to conventional ZDB circuits. The present invention may be configured such that each of the output signals CLKa–CLKn is multiplexed to the PLL 112 feedback input on a dynamically programmable (e.g., real-time) basis. The feedback programming in the circuit 120 may optimize the ZDB 100 response to the particular system where the ZDB 100 is implemented. The programming in the circuit 120 may be configured to control selection of the signal FEEDBACK as a binary weighting function. The present invention may be configured to provide fractional frequency synthesis via the output dividers 180 (e.g., P, P–1 (swallow)) and the input frequency divider (e.g., Q) and the PLL 112 feedback.

Conventional ZDB circuits include one fixed buffered output to serve as feedback reference for all of the output clock signals. In conventional ZDB circuits except for the feedback reference, all of the n–1 output signals operate in an open-loop configuration and are susceptible to independent loading effects, temperature variations, supply voltage droops and surges, etc. The present invention may be configured such that all of the buffered output signals CLKa–CLKn are multiplexed to approximate a closed-loop system. The multiplexing of the output clock signals CLKa–CLKn may be implemented via a binary weighted programming function determined by the system designer. The effects of independent loading, temperature variations, etc. may be mitigated via the feedback process. The present invention may be configured with clock tree distribution and synchronization via the root ZDB 100a serving as a synchronizer to the remaining distribution (branch) ZDB circuits 100b–100n in the circuit 200.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
a first circuit configured to present a plurality of output clock signals in response to a reference clock signal and a feedback signal; and
a second circuit configured to select one of said plurality of output clock signals as said feedback signal in response to a first control signal, wherein said first control signal is configured to minimize a difference in delay between said plurality of output clock signals.

2. The apparatus according to claim 1, wherein said first circuit comprises:
a phase locked loop (PLL) circuit configured to generate a first of said output clock signals in response to said reference clock signal and said feedback signal; and
a plurality of buffer circuits configured to generate a remainder of said plurality of output clock signals in response to said first of said output clock signals.

3. The apparatus according to claim 2, wherein said buffer circuits comprise tri-state buffers further configured to generate said output signals in response to an enable control signal.

4. The apparatus according to claim 2, wherein said second circuit comprises:
   a multiplexer circuit configured to select said one of said plurality of output clock signals as said feedback signal in response to said first control signal;
   a control circuit configured to generate said first control signal in response to said first output clock signal and a second control signal; and
   a memory circuit configured to present said second control signal.

5. The apparatus according to claim 1, wherein said first control signal is configured in response to selection of said output signals from a group consisting of a round-robin, a binary weighting, and a post-manufacture criterion.

6. The apparatus according to claim 5, wherein said binary weighting comprises a best fit of said difference in delay between said output signals.

7. The apparatus according to claim 5, wherein said post-manufacture criterion is selected from a group consisting of an apparatus operating temperature, an apparatus loading effect, an apparatus supply voltage variation, an apparatus supply ground variation, and an apparatus operating frequency.

8. The apparatus according to claim 1, further comprising a plurality of said first and second circuits configured as a clock tree structure, wherein:
   a first one of said first circuits is further configured to present one or more of said output clock signals as a respective reference signal to a remainder of said plurality of first circuits;
   a respective one of said second circuits is configured to select one of said one or more output clock signals generated by said plurality of first circuits as a respective feedback signal and said one of said second circuits is configured to synchronize said clock tree structure; and
   a remainder of said second circuits are each configured to select one of a respective plurality of output clock signals as a respective feedback signal.

9. The apparatus according to claim 2, wherein said second circuit is configured to select said feedback signal in response to an edge of each cycle of said first output clock signal.

10. The apparatus according to claim 4, wherein said first circuit further comprises a delay circuit configured to compensate said reference clock signal for a delay of said multiplexer circuit.

11. The apparatus according to claim 3, wherein said apparatus comprises a dual-modulus zero delay buffer (ZDB) and said first circuit further comprises (i) a first divider circuit configured to generate a divided version of said reference clock signal and (ii) one or more second divider circuits configured to generate one or more divided versions of said first output clock signal.

12. The apparatus according to claim 4, wherein said memory is selected from the group consisting of silicon, oxide, nitride, oxide, silicon (SONOS) technology memory, flash memory, and a look-up table.

13. The apparatus according to claim 4, wherein said control circuit comprises a programmable state machine.

14. An apparatus for minimizing a difference in delay between a plurality of output clock signals comprising:
   means for generating said output clock signals in response to a reference clock signal and a feedback signal; and
   means for selecting one of said output clock signals as said feedback signal in response to a control signal.

15. A method for minimizing a difference in delay between a plurality of output clock signals comprising the steps of:
   (A) generating said output clock signals in response to a reference clock signal and a feedback signal; and
   (B) selecting one of said output clock signals as said feedback signal in response to a control signal.

16. The method according to claim 15, wherein said step (A) comprises the sub-steps of:
   generating a first of said output clock signals in response to said reference clock signal and said feedback signal; and
   generating a remainder of said plurality of output clock signals in response to said first output clock signal.

17. The method according to claim 16, wherein said step (B) comprises the sub-steps of:
   selecting said one of said plurality of output clock signals as said feedback signal; and
   generating said first control signal in response to said first output signal and a second control signal; and
   storing said second control signal in a memory.

18. The method according to claim 17, wherein step (B) further comprises the step of:
   compensating said reference signal for a delay in said selecting said one of said plurality of output clock signals.

19. The method according to claim 17, wherein said method further comprises the steps of:
   generating a divided version of said reference clock signal; and
   generating one or more divided versions of said first output clock signal.

20. The method according to claim 17, wherein step (B) further comprises:
   selecting said feedback signal in response to an edge of each cycle of said first output clock signal.

* * * * *